(12) United States Patent
Cho

(10) Patent No.: US 7,317,341 B2
(45) Date of Patent: Jan. 8, 2008

(54) DUTY CORRECTION DEVICE

(75) Inventor: Kwang-Jun Cho, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 55 days.

(21) Appl. No.: 11/323,511

(22) Filed: Dec. 29, 2005

(65) Prior Publication Data
US 2007/0080732 A1    Apr. 12, 2007

(30) Foreign Application Priority Data
Sep. 29, 2005 (KR) ................. 10-2005-0091518

(51) Int. Cl.
*H03K 3/017* (2006.01)
*H03K 5/04* (2006.01)
*H03K 7/08* (2006.01)

(52) U.S. Cl. ............... 327/175; 327/172; 327/173; 327/174; 327/176

(58) Field of Classification Search ........ 327/172–176
See application file for complete search history.

(56) References Cited

U.S. PATENT DOCUMENTS

| | | | | |
|---|---|---|---|---|
| 4,236,114 A | * | 11/1980 | Sasaki | 327/176 |
| 5,945,857 A | * | 8/1999 | Havens | 327/175 |
| 5,945,862 A | * | 8/1999 | Donnelly et al. | 327/278 |
| 6,040,726 A | * | 3/2000 | Martin | 327/175 |
| 6,765,421 B2 | * | 7/2004 | Brox et al. | 327/175 |
| 6,853,225 B2 | | 2/2005 | Lee | |
| 6,859,081 B2 | | 2/2005 | Hong et al. | |
| 6,934,215 B2 | | 8/2005 | Chung et al. | |
| 6,992,516 B2 | * | 1/2006 | Yeh | 327/175 |
| 2004/0066873 A1 | | 4/2004 | Cho et al. | |
| 2005/0184779 A1 | | 8/2005 | Yoo et al. | |
| 2005/0184780 A1 | * | 8/2005 | Chun | 327/175 |
| 2005/0212575 A1 | | 9/2005 | Kim | |

FOREIGN PATENT DOCUMENTS

JP    2004-129255    4/2004
KR    10-2005-0055925    6/2005

* cited by examiner

*Primary Examiner*—Tuan T. Lam
*Assistant Examiner*—Patrick O'Neill
(74) *Attorney, Agent, or Firm*—Blakely, Sokoloff, Taylor & Zafman

(57) ABSTRACT

A duty correction device includes: a duty correction unit having a plurality of duty correction cells for selectively activating the duty correction cells according to a count signal to adjust a pulse width of an input clock and output the adjusted clock as an output clock; a phase splitter for generating a rising and a falling clocks by phase-splitting the output clock; a DCC pumping unit for generating a rising and a falling duty ratio correction signals according to a reset signal; a voltage comparing unit for generating counting increase and decrease signals according to a result of comparing the rising and the falling duty ratio correction signals in response to a comparison control signal; a comparison control unit for generating the comparison control signal and the reset signal; and a counter for increasing/decreasing a value of the count signal according to the counting increase and decrease signals.

15 Claims, 3 Drawing Sheets

DUTY CORRECTION DEVICE

FIELD OF INVENTION

The present invention relates to a duty cycle correction device; and, more particularly, to a digital-type duty cycle correction circuit for reducing a size and a power consumption by increasing a high pulse width of an output clock and decreasing a low pulse width of the output clock in comparison with an input clock.

DESCRIPTION OF PRIOR ART

Generally, a delay locked loop (DLL) is included in a synchronous semiconductor memory device in order to synchronize an internal clock of the synchronous semiconductor memory device with an external clock. That is, when the external clock is inputted to the synchronous semiconductor memory device, a time delay is generated and, thus, a clock skew between the external clock and the internal clock is generated. Therefore, the DLL is employed in the synchronous semiconductor memory device for generating the internal clock by compensating the clock skew. The DLL adjusts the time delay to thereby synchronize the internal cock with the external clock.

For instance, in case of a double data rate synchronous dynamic random access memory (DDR SDRAM), the DDR SDRAM receives an external clock in order to generate an internal clock having a predetermined time delay so that a data can be aligned to an edge of the external clock. Herein, the DLL is employed for generating the internal clock having the predetermined time delay.

Meanwhile, as an operational speed of an SDRAM is increased, a performance of the SDRAM is greatly affected by a performance of the DLL. Accordingly, since a design margin is decreased if a duty error is increased, a duty cycle of the internal clock becomes an important issue. Therefore, a duty cycle correction technology applied to the DLL has been developed for securing an enough design margin.

FIG. 1 is a block diagram showing a conventional DLL having a digital mixing type DCC.

As shown, the conventional DLL includes a buffer 10, a global control unit 11, phase detection units 20 and 27, replicas 21 and 28, delay lines (DCDL) 22 and 29, fine delay units (FDU) 23 and 30, a delay line (ECDL) control unit 24, a mode generator 25, a DCDL&FDU control unit 26, phase mixers 40 and 43, buffers 41 and 42, a dummy load 44, a phase detection unit 45 and a DCC control unit 50.

The buffer 10 receives an external clock CLK and an inverted external clock/CLK to generate a reference clock refclk and a rising clock rclk activated at a rising edge of a clock. The phase detection unit 20 detects a phase of the reference clock refclk and a phase of an internal clock iclk1 in order to output the detected result to the ECDL control unit 24. The phase detection unit 27 detects a phase of the reference clock refclk and a phase of an internal clock iclk2 in order to output the detected result to the mode generator 25.

The replica 21 outputs the internal clock iclk1 to the phase detection unit 20 according to a feed-backed clock fbclk1. Similarly, the replica 28 outputs the internal clock iclk2 to the phase detection unit 27 according to a feed-backed clock fbclk2.

The phase mixer 40 generates the feed-backed clock fbclk1 by mixing clocks clk1 and clk2 outputted from the FDUs 23 and 30 respectively. Likewise, the phase mixer 43 generates the feed-backed clock fbclk2 by mixing the clocks clk2 and clk1 outputted from the FDUs 30 and 23 respectively.

Meanwhile, in case of a DDR SDRAM, a data is inputted/outputted at rising and falling edges of the external clock CLK. Therefore, a DLL for use in the DDR SDRAM is required to be capable of correcting a duty (a ratio of a high pulse width to one cycle) error of the external clock CLK so that the data input/output can be synchronized with the rising and the falling edges of the external clock CLK. For instance, even though one of a high pulse width and a low pulse width of the external clock CLK is larger than the other, an internal clock should be corrected to have a 50%-duty.

There are two types of a duty cycle corrector (DCC) for use in the above-mentioned DLL: one is a digital mixing type and an analog type. Although the analog type DCC has a high accuracy, the analog type DCC is not suitable for a high-speed system. The digital mixing type DCC has a high accuracy and a fast response time. However, as shown in FIG. 1, since the digital mixing type DCC uses two clocks, it is difficult to reduce a size and a power consumption.

SUMMARY OF INVENTION

It is, therefore, an object of the present invention to provide a digital-type duty cycle correction circuit for reducing a size and a power consumption by increasing a high pulse width of an output clock and decreasing a low pulse width of the output clock in comparison with an input clock.

In accordance with an aspect of the present invention, there is provided a duty correction device including: a duty correction unit having a plurality of duty correction cells for selectively activating the duty correction cells according to a count signal to thereby adjust a pulse width of an input clock and output the adjusted clock as an output clock; a phase splitter for generating a rising clock and a falling clock having an opposite phase by splitting a phase of the output clock; a duty cycle corrector (DCC) pumping unit for generating a rising and a falling duty ratio correction signals by performing a pumping operation to the rising and the falling clocks according to a reset signal; a voltage comparing unit for generating a counting increase signal and a counting decrease signal according to a result of comparing the rising and the falling duty ratio correction signals in response to a comparison control signal; a comparison control unit for outputting the comparison control signal to the voltage comparing unit in synchronization with the output clock and for outputting the reset signal to the DCC pumping unit when a duty ratio matching of the input clock and the output clock is completed; and a counter for increasing/decreasing a value of the count signal according to the counting increase and decrease signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a duty cycle correction device in accordance with the present invention will be described in detail referring to the accompanying drawings.

Figure 1:
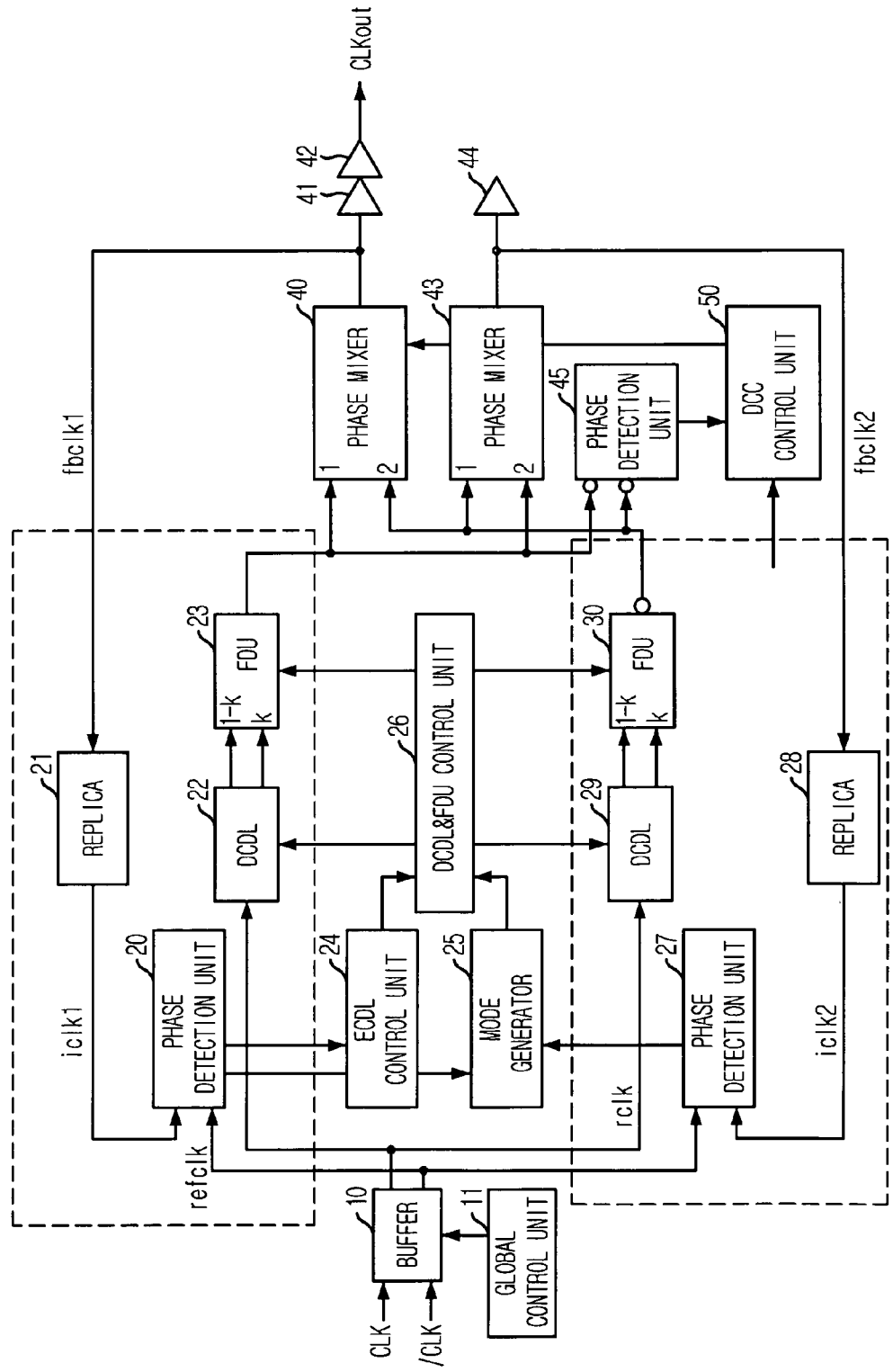
FIG. 1 is a block diagram showing a conventional DLL having a digital mixing type DCC.
Figure 2:
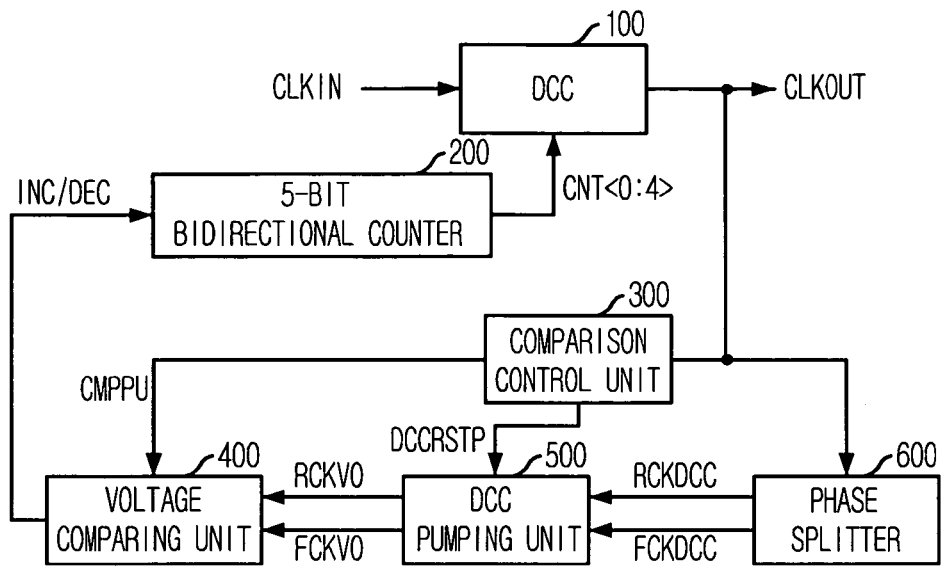
FIG. 2 is a block diagram showing a duty cycle correction device in accordance with a preferred embodiment of the present invention.

FIG. 2 is a block diagram showing a duty cycle correction device in accordance with a preferred embodiment of the present invention.

As shown, the duty cycle correction device includes a duty cycle corrector (DCC) 100, a 5-bit bidirectional counter 200, a comparison control unit 300, a voltage comparing unit 400, a DCC pumping unit 500 and a phase splitter 600.

The duty cycle corrector 100 corrects a duty of an input clock CLKIN according to a count signal CNT<0:4> generated by the 5-bit bidirectional counter 200 in order to generate an output clock CLKOUT. That is, the duty cycle corrector 100 increases or decreases a high pulse width or a low pulse width of the input clock CLKIN based on the count signal CNT<0:4> to thereby generate the output clock CLKOUT.

The 5-bit bidirectional counter 200 increases or decreases the count signal CNT<0:4> according to a counting increase/decrease signal INC/DEC. Herein, the 5-bit bidirectional counter 200 can be embodied with a shift register type for controlling the increase/decrease of the count signal CNT<0:4>.

The comparison control unit 300 outputs a comparison control signal CMPPU to the voltage comparing unit 400 in synchronization with the output clock CLKOUT. When a duty ratio matching between the input clock CLKIN and the output clock CLKOUT is completed, the comparison control unit 300 outputs a reset signal DCCRSTP to the DCC pumping unit 500 after changing a generation period of the reset signal DCCRSTP.

The voltage comparing unit 400 compares duty ratio correction signals RCKVO and FCKVO in response to the comparison control signal CMPPU to thereby generate the counting increase/decrease signal INC/DEC according to the comparison result.

The DCC pumping unit 500 performs a pumping operation to a rising clock RCKDCC and a falling clock FCKDCC according to the reset signal DCCRSTP to thereby generate the duty ratio correction signals RCKVO and FCKVO which correspond to a pulse width of the rising clock RCKDCC and a pulse width of the falling clock FCKDCC respectively. Herein, it is preferred that the DCC pumping unit 500 is embodied with a current mirror type amplifier.

The phase splitter 600 generates phase split rising and falling clocks RCKDCC and FCKDCC having a 180-degree phase difference according to the output clock CLKOUT.

Figure 3:
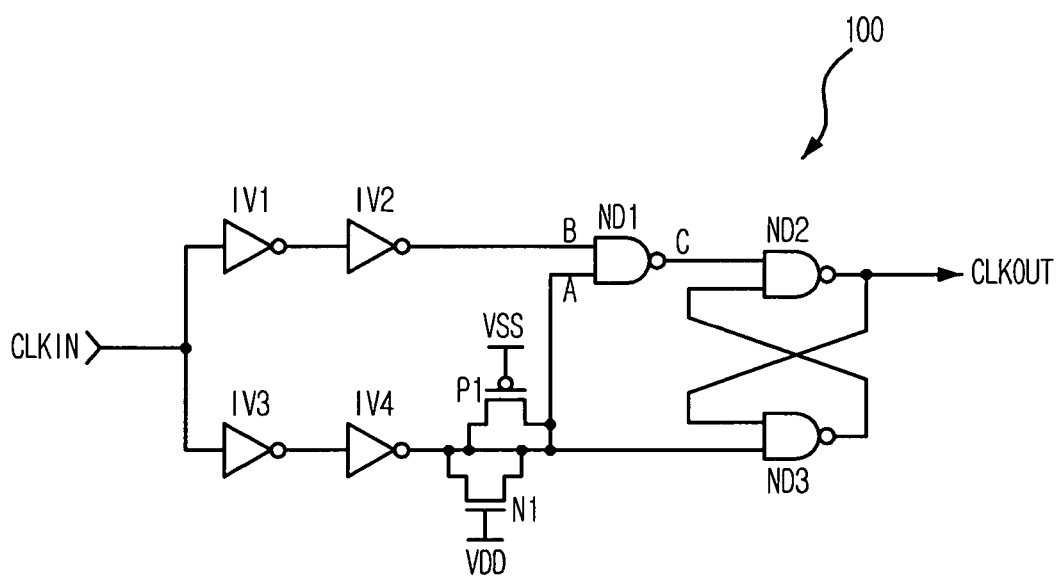
FIG. 3 is a schematic circuit diagram showing a duty correction cell included in the duty cycle corrector shown in FIG. 2.

FIG. 3 is a schematic circuit diagram showing a duty correction cell included in the duty cycle corrector 100 shown in FIG. 2.

As shown, the duty cycle corrector 100 includes a first to a fourth inverters IV1 to IV4, a p-type metal oxide semiconductor (PMOS) transistor P1, an n-type metal oxide semiconductor (NMOS) transistor N1 and a first to a third NAND gates ND1 to ND3.

The first and the second inverters IV1 and IV2 delay the input clock CLKIN and output the delayed clock to a node B. Likewise, the third and the fourth inverters IV3 and IV4 delay the input clock CLKIN.

The PMOS transistor P1 is connected between a node A and an output terminal of the fourth inverter IV4, and a gate of the PMOS transistor P1 is coupled to a ground voltage VSS. The NMOS transistor N1 is connected between the node A and the output terminal of the fourth inverter IV4, and a gate of the NMOS transistor N1 is coupled to a power supply voltage VDD.

The first NAND gate ND1 performs a logic NAND operation to signals of the nodes A and B and outputs a result of the logic NAND operation to a node C. The second NAND gate ND2 performs a logic NAND operation to an output of the first NAND gate ND1 and an output of the third NAND gate ND3 to thereby generate the output clock CLKOUT. The third NAND gate ND3 performs a logic NAND operation to a signal of the node A and the output clock CLKOUT and outputs a result of the logic NAND operation to the second NAND gate ND2.

Referring to FIGS. 2 and 3, an operation of the duty cycle correction device is described below.

The phase splitter 600 splits a phase of the output clock CLKOUT to thereby generate the rising clock RCKDCC and the falling clock FCKDCC, wherein the rising clock RCKDCC has a same phase in comparison with the output clock CLKOUT and the falling clock FCKDCC is an inverted version of the rising clock RCKDCC. The comparison control unit 300 outputs the comparison control signal CMPPU to the voltage comparing unit 400 in synchronization with the output clock CLKOUT and also activates the reset signal DCCRSTP and outputs the activated reset signal to the DCC pumping unit 500 after the duty ratio matching between the input clock CLKIN and the output clock CLKOUT is completed.

Thereafter, in response to the activated reset signal DCCRSTP, the DCC pumping unit 500 performs a pumping operation to the rising clock RCKDCC and the falling clock FCKDCC to generate the duty ratio correction signals RCKVO and RCKVO. Herein, a current or a voltage level of the duty ratio correction signals RCKVO and RCKVO is controlled to be higher or lower than a predetermined level according to a mismatch of a high pulse width and a low pulse width of the output clock CLKOUT.

Thereafter, when the comparison control signal CMPPU is activated, the voltage comparing unit 400 generates the counting increase signal INC or the counting decrease signal DEC for respectively increasing or decreasing a high pulse width of the output clock CLKOUT in comparison with the input clock CLKIN according to a result of comparing the duty ratio correction signals RCKVO and FCKVO.

Thereafter, the 5-bit bidirectional counter 200 increases or decreases a value of the binary-coded count signal CNT<0:4> by 1 according to the counting increase signal INC and the counting decrease signal DEC. That is, the 5-bit bidirectional counter 200 increases a value of the count signal CNT<0:4> by 1 when the counting increase signal INC is activated as a logic high level or decreases the value of the count signal CNT<0:4> by 1 when the counting decrease signal DEC is activated as a logic high level. Herein, the 5-bit bidirectional counter 200 is organized as a binary-type, and a duty correction ability of the duty cycle corrector 100 ranges from several pico-seconds to hundreds of pico-seconds.

For instance, by arranging one, double or predetermined numbers of the duty correction cell shown in FIG. 3, a duty correction ability can have various values of 20 ps, 40 ps, 80 ps and 160 ps. In this case, the duty cycle corrector 100 has a duty correction ability of ±300 ps according to a combination of the count signal CNT<0:4>.

Meanwhile, the duty cycle corrector 100 includes a plurality of duty correction cells shown in FIG. 3 in order to selectively turn on/off the plurality of duty correction cells according to the count signal CNT<0:4>. Accordingly, a duty of the output clock CLKOUT is adjusted by the duty cycle corrector 100 in comparison with the input clock CLKIN so that the output clock CLKOUT can have a 50%-duty. That is, by controlling a rising timing and a falling timing of the input clock CLKIN, a high pulse width of the output clock CLKOUT is increased and a low pulse width of the output clock CLKOUT is decreased in comparison with the input clock CLKIN.

Figure 4:
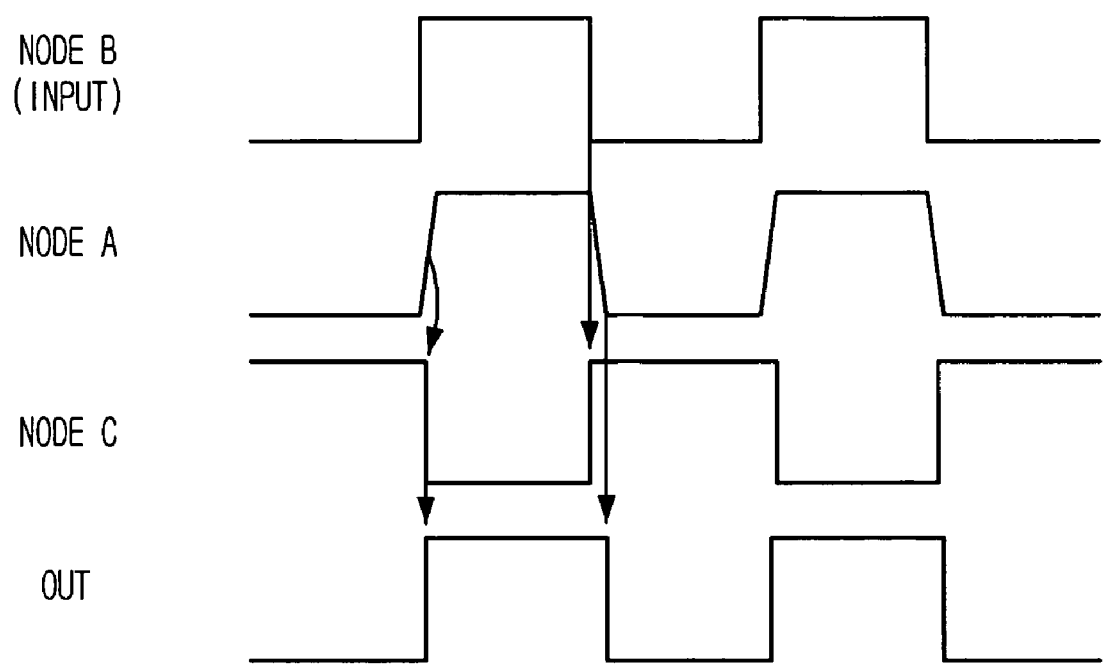
FIG. 4 is a wave diagram showing an operation of the duty correction cell shown in FIG. 3.

FIG. 4 is a wave diagram showing an operation of the duty correction cell shown in FIG. 3.

The operation of the duty correction cell is described below referring to FIGS. 3 and 4.

The first and the second inverters IV1 and IV2 delay the input clock CLKIN and output the delayed clock to the node B. Likewise, the third and the fourth inverters IV3 and IV4 delay the input clock CLKIN.

The PMOS transistor P1 is connected between the node A and an output terminal of the fourth inverter IV4 and receives the ground voltage VSS through the gate of the PMOS transistor P1. The NMOS transistor N1 is connected between the node A and the output terminal of the fourth inverter IV4 and receives the power supply voltage VDD through the gate of the NMOS transistor N1. Accordingly, the PMOS transistor P1 and the NMOS transistor N1 are constantly turned-on and are operated as an RC-delay.

Thereafter, the first NAND gate ND1 performs a logic NAND operation to signals of the nodes A and B. Therefore, a rising of the input clock CLKIN is outputted to the node A after being delayed for a predetermined time by the RC-delay (P1 and N1) coupled to the node A. Accordingly, a rising of the input clock CLKIN at the node A is delayed in comparison with that of the input clock CLKIN at the node B.

Meanwhile, a falling of the input clock CLKIN is outputted to the node C by a falling of the node B regardless of the RC-delay. That is, a falling of the node C is outputted in synchronization with a rising edge of the node A and a rising of the node C is outputted in synchronization with a falling edge of the node B.

Thereafter, signals of the nodes C and A are inputted to a flip-flop constituted with the second and the third NAND gates ND2 and ND3. Accordingly, a rising of the output clock CLKOUT is generated in synchronization with a falling of the node C and a falling of the output clock CLKOUT is generated in synchronization with a rising of the node A.

Herein, since a rising and a falling of the node A have a little delay, the node A has a little delay time in comparison with the node C. Therefore, an inverting of the flip-flop, particularly, a falling timing can be delayed so that a falling of the output clock CLKOUT is a little delayed in comparison with the input clock CLKIN.

As a result, in accordance with the present invention, a size and a power consumption of a duty cycle correction device for use in a digital type DLL can be reduced and, thus, a response time can be improved so that a high-speed operation is possible.

The present application contains subject matter related to Korean patent application No. 2005-91518, filed in the Korean Patent Office on, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A duty correction device, comprising:
   a duty correction unit having a plurality of duty correction cells for selectively activating the duty correction cells according to a count signal to thereby adjust a pulse width of an input clock and output an output clock;
   a phase splitter for generating a rising clock and a falling clock having an opposite phase by splitting a phase of the output clock;
   a duty cycle corrector (DCC) pumping unit for generating a rising and a falling duty ratio correction signals by performing a pumping operation to the rising and the falling clocks according to a reset signal;
   a voltage comparing unit for generating a counting increase signal and a counting decrease signal according to a result of comparing the rising and the falling duty ratio correction signals in response to a comparison control signal;
   a comparison control unit for outputting the comparison control signal to the voltage comparing unit in synchronization with the output clock and for outputting the reset signal to the DCC pumping unit when a duty ratio matching of the input clock and the output clock is completed; and
   a counter for increasing/decreasing a value of the count signal according to the counting increase and decrease signals,
   wherein the duty correction cell outputs the output clock by logically combining the input clock and a delayed clock delayed by a RC delay.

2. The duty correction device as recited in claim 1, wherein the DCC pumping unit includes a current mirror type amplifier.

3. The duty correction device as recited in claim 1, wherein the counter includes a 5-bit bidirectional counter.

4. The duty correction device as recited in claim 1, wherein the counter includes a shift register.

5. The duty correction device as recited in claim 1, wherein the duty correction unit increases a high pulse width and decreases a low pulse width of the input clock to generate the output clock.

6. The duty correction device as recited in claim 1, wherein each duty correction cell delays a falling timing of the output clock for a predetermined time in comparison with the input clock.

7. The duty correction device as recited in claim 1, wherein each duty correction cell includes:
   a first inverter chain for delaying the input clock and for outputting the delayed clock to a first node;
   a second inverter chain for delaying the input clock;
   a delay unit, operating as the RC delay, for delaying an output of the second inverter chain in order to output a delayed signal to a second node;
   a first logic gate for performing a logic operation to signals outputted from the first and the second nodes; and
   a flip-flop for receiving signals outputted from the first logic gate and the second node in order to generate the output clock.

8. The duty correction device as recited in claim 7, wherein the first inverter chain delays the input clock not inverting the input clock.

9. The duty correction device as recited in claim 7, wherein the second inverter chain delays the input clock not inverting the input clock.

10. The duty correction device as recited in claim 7, wherein the delay unit includes:
- a p-type metal oxide semiconductor (PMOS) transistor connected between an output terminal of the second inverter chain and the second node for receiving a ground voltage through a gate of the PMOS transistor; and
- an n-type metal oxide semiconductor (NMOS) transistor connected between the output terminal of the second inverter chain and the second node for receiving a power supply voltage through a gate of the NMOS transistor.

11. The duty correction device as recited in claim 7, wherein the first logic gate is a first NAND gate.

12. The duty correction device as recited in claim 7, wherein the flip-flop includes:
- a second NAND gate for performing a logic NAND operation to an output of the first logic gate and a first output signal to thereby generate the output clock; and
- a third NAND gate for performing a logic NAND operation to an output of the second NAND gate and an output of the delay unit.

13. The duty correction device as recited in claim 7, wherein a rising of the output clock is generated in synchronization with a falling edge of an output of the first logic gate and a falling of the output clock is generated in synchronization with a rising edge of a signal of the second node.

14. A duty correction device, comprising:
- a duty correction unit having a plurality of duty correction cells for selectively activating the duty correction cells according to a count signal to adjust a pulse width of an input clock and output an output clock;
- a duty correction control signal generation unit for generating a duty correction control signal based on the output clock; and
- a counter for increasing/decreasing a value of the count signal according to the duty correction control signal, wherein each of the duty correction cells includes:
- a first inverter chain for delaying the input clock;
- a second inverter chain for delaying the input clock;
- a delay unit for delaying an output of the second inverter chain;
- a logic gate for logically combining outputs of the first inverter chain and the delay unit; and
- a flip-flop for receiving outputs of the logic gate and the delay unit in order to generate the output clock.

15. The duty correction device as recited in claim 14, wherein the duty correction control signal generation unit includes:
- a phase splitter for generating a rising clock and a falling clock having an opposite phase by splitting a phase of the output clock;
- a duty cycle corrector (DCC) pumping unit for generating a rising and a falling duty ratio correction signals by performing a pumping operation to the rising and the falling clocks according to a reset signal;
- a voltage comparing unit for generating the duty correction control signal according to a result of comparing the rising and the falling duty ratio correction signals in response to a comparison control signal; and
- a comparison control unit for outputting the comparison control signal to the voltage comparing unit in synchronization with the output clock and for outputting the reset signal to the DCC pumping unit when a duty ratio matching of the input clock and the output clock is completed.

* * * * *